United States Patent
Kawaguchi et al.

(10) Patent No.: US 8,115,137 B2
(45) Date of Patent: Feb. 14, 2012

(54) LASER ANNEALING METHOD AND LASER ANNEALING APPARATUS

(75) Inventors: Norihito Kawaguchi, Tokyo (JP); Ryusuke Kawakami, Tokyo (JP); Kenichiro Nishida, Tokyo (JP); Miyuki Masaki, Tokyo (JP); Masaru Morita, Tokyo (JP); Atsushi Yoshinouchi, Tokyo (JP)

(73) Assignee: IHI Corporation, Tokyo (JP)

( * ) Notice: Subject to any disclaimer, the term of this patent is extended or adjusted under 35 U.S.C. 154(b) by 0 days.

(21) Appl. No.: 12/997,543

(22) PCT Filed: Jun. 12, 2008

(86) PCT No.: PCT/JP2008/060749
§ 371 (c)(1),
(2), (4) Date: Dec. 10, 2010

(87) PCT Pub. No.: WO2009/150733
PCT Pub. Date: Dec. 17, 2009

(65) Prior Publication Data
US 2011/0086441 A1    Apr. 14, 2011

(51) Int. Cl.
*H01L 21/00* (2006.01)
*H01L 21/20* (2006.01)
*H01L 21/36* (2006.01)

(52) U.S. Cl. .............. 219/121.73; 438/7; 438/509

(58) Field of Classification Search .......... 438/7, 509; 219/121.73; 257/E21.53
See application file for complete search history.

(56) References Cited

U.S. PATENT DOCUMENTS

| | | | |
|---|---|---|---|
| 5,727,009 A | 3/1998 | Tajiri et al. | |
| 6,172,820 B1 | 1/2001 | Kuwahara | |
| 2003/0034093 A1* | 2/2003 | Morris et al. | 148/197 |
| 2004/0241923 A1 | 12/2004 | Toida | |
| 2005/0031261 A1 | 2/2005 | Tanaka | |
| 2005/0056626 A1 | 3/2005 | Gross et al. | |
| 2007/0045575 A1 | 3/2007 | Bruland | |
| 2009/0218475 A1* | 9/2009 | Kawakami et al. | 250/201.1 |

FOREIGN PATENT DOCUMENTS

| | | |
|---|---|---|
| JP | 5-41006 A | 2/1993 |
| JP | 10-242073 A | 9/1998 |

(Continued)

OTHER PUBLICATIONS

K. Nishida et al., "Performance of Polycrystallization with High Power Solid Green Laser," AM-FPD, 2006.

(Continued)

*Primary Examiner* — William M. Brewster
(74) *Attorney, Agent, or Firm* — Griffin & Szipl, P.C.

(57) ABSTRACT

In laser annealing using a solid state laser, a focus position of a minor axial direction of a rectangular beam is easily corrected depending on positional variation of a laser irradiated portion of a semiconductor film. By using a minor-axis condenser lens 29 condensing incident light in a minor axial direction and a projection lens 30 projecting light, which comes from the minor-axis condenser lens 29, onto a surface of a semiconductor film 3, laser beam 1 is condensed on the surface of the semiconductor film 3 in the minor axial direction of a rectangular beam. The positional variation of a vertical direction of the semiconductor film 3 in a laser irradiated portion of the semiconductor film 3 is detected by a positional variation detector 31, and the minor-axis condenser lens 29 is moved in an optical axis direction based on a value of the detection.

15 Claims, 10 Drawing Sheets

FOREIGN PATENT DOCUMENTS

| | | |
|---|---|---|
| JP | 2835924 B2 | 10/1998 |
| JP | 10-294288 A | 11/1998 |
| JP | 10-333077 A | 12/1998 |
| JP | 11-023952 | 1/1999 |
| JP | 11-058053 | 3/1999 |
| JP | 11-214306 A | 8/1999 |
| JP | 2000-349041 | 12/2000 |
| JP | 2000338447 A | 12/2000 |
| JP | 2001-68430 A | 3/2001 |
| JP | 2001068430 | 3/2001 |
| JP | 3191702 B2 | 5/2001 |
| JP | 3204307 A | 9/2001 |
| JP | 2003-124136 A | 4/2003 |
| JP | 2003-282477 | 10/2003 |
| JP | 3502981 | 12/2003 |
| JP | 2005-109460 A | 4/2005 |
| JP | 2005109460 | 4/2005 |
| JP | 2006-32843 | 2/2006 |
| JP | 2006-49635 A | 2/2006 |
| JP | 2006049635 | 2/2006 |
| JP | 2006-119210 | 5/2006 |
| JP | 2006-287183 A | 10/2006 |
| JP | 2006287183 | 10/2006 |
| JP | 2007-214527 A | 8/2007 |
| JP | 2007214527 | 8/2007 |
| JP | 2008-130713 | 6/2008 |
| JP | 2008-159836 A | 7/2008 |

OTHER PUBLICATIONS

T. Okamoto et al., "Development of Green Laser Annealing Optical System for Low-Temperature Polysilicon," RTM-05-28, pp. 15-22, 2006.

International Search Report, issued in corresponding International Application No. PCT/JP2008/060749, completed Aug. 18, 2008, mailed Aug. 26, 2008.

International Search Report issued in corresponding application PCT/JP2008/060044 in co-pending U.S. Appl. No. 12/811,818, completed Aug. 20, 2008, mailed Sep. 2, 2008.

Office Action issued in related Korean Patent Application No. 10-2010-7012710, dated Jul. 29, 2011.

Office Action issued in related Chinese Patent Application No. 200880124168.6, dated Aug. 15, 2011.

Office Action issued in related German Patent Application No. 102008047611.0 on Sep. 22, 2011.

Office Action issued in related German Patent Application No. 102008029622.8 on Sep. 26, 2011.

Office action dated Aug. 12, 2011 in co-pending U.S. Appl. No. 12/811,818.

* cited by examiner

VERTICAL POSITIONAL VARIATION OF
IRRADIATED SURFACE (mm)

VERTICAL POSITIONAL VARIATION OF
IRRADIATED SURFACE (mm)

VERTICAL POSITIONAL VARIATION OF
IRRADIATED SURFACE (mm)

VERTICAL POSITIONAL VARIATION OF
IRRADIATED SURFACE (mm)

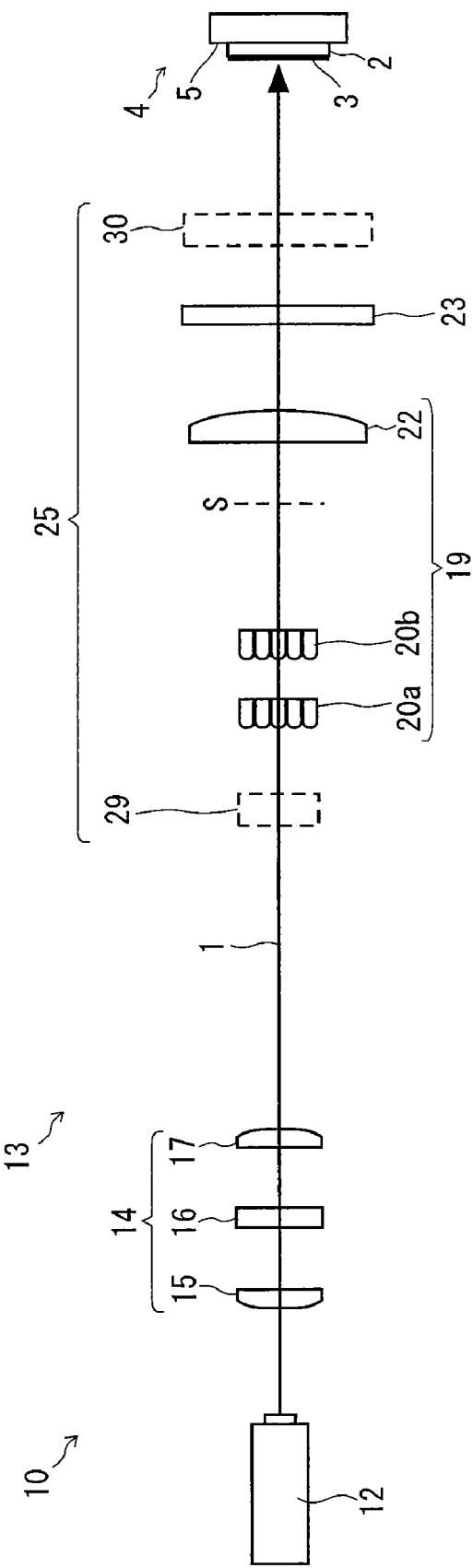

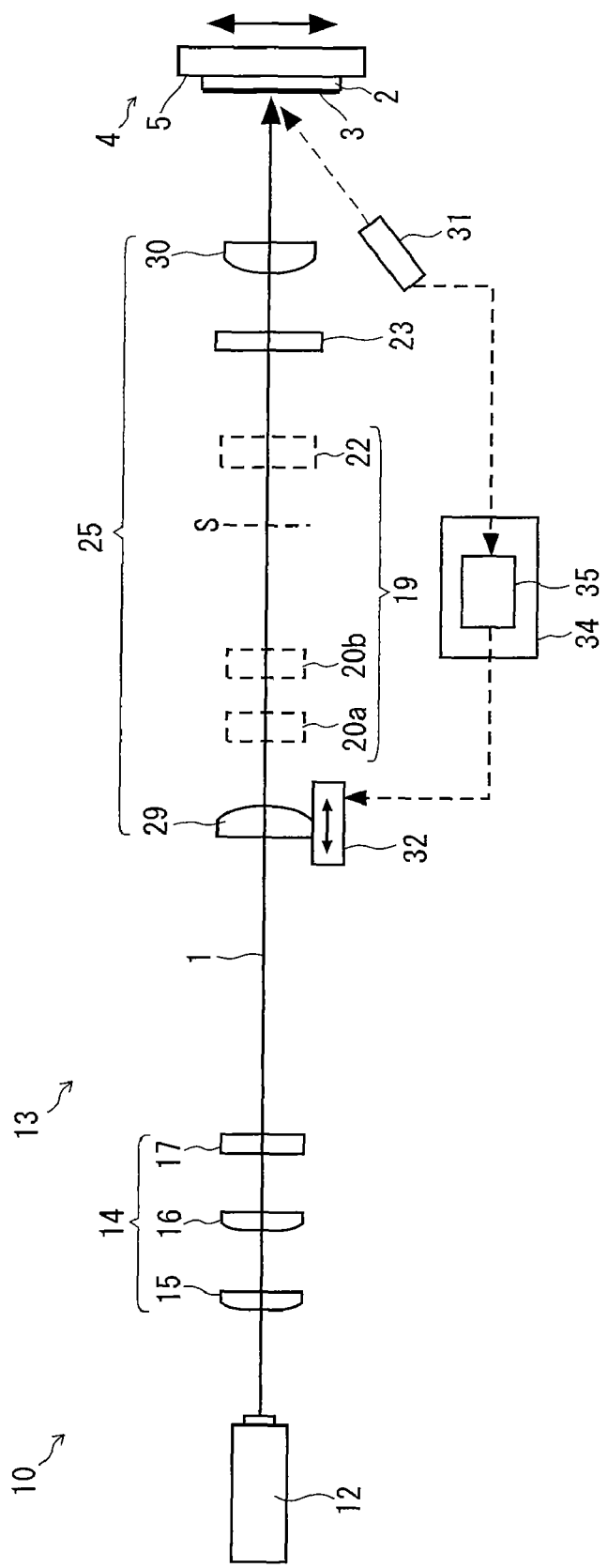

LASER ANNEALING METHOD AND LASER ANNEALING APPARATUS

This is a National Phase Application in the United States of International Patent Application No. PCT/JP2008/060749 filed Jun. 12, 2008. The entire disclosure of the above patent application is hereby incorporated by reference.

BACKGROUND OF THE INVENTION

1. Technical Field of the Invention

The present invention relates to a laser annealing method and a laser annealing apparatus that reform a semiconductor film by irradiating the semiconductor film with pulse laser beam shaped into a rectangular beam.

2. Description of the Related Art

Laser annealing is a process of forming a polycrystalline silicon film by melting and solidifying an amorphous silicon film (hereinafter referred to as "a-Si film") deposited on a substrate made of low-melting point glass (typically alkali-free glass) by irradiating to the a-Si film with a laser beam (For example, see Patent Document 1). Because of their electric properties superior to those of a-Si films, crystallized silicon films are being used for transistors to drive liquid crystal displays, which require high definition display, of portable telephones, digital cameras and so on.

The laser annealing is performed by scanning a semiconductor film (for example, an a-Si film), relatively in a minor (shorter) axial direction of the beam, on a substrate with a rectangular beam having its elongated section. The rectangular beam is shaped from a pulse laser beam from a laser source, using an optical system. In general, the scanning of the rectangular beam is done by moving the substrate. This scanning is carried out in such a manner that laser irradiated regions are partially overlapped with each other.

The following Patent Documents 2 and 3 disclose an entire configuration of an optical system of a laser annealing apparatus using an excimer laser as a laser source (hereinafter referred to as "excimer laser annealing apparatus"). The shown optical system includes a cylindrical lens array that splits a laser beam into a plurality of beams in major (longer) and minor (shorter) axial directions, and a condense lens that condenses the beams split by the cylindrical lens array. In the minor axial direction, reduction-projection is performed by a projection lens after once making an energy profile of the beams uniform.

In the above-described excimer laser annealing apparatus, the dimension of the beam is a degree of 365 mm in major axis and 0.4 mm in minor axis. An excimer laser has large width of minor axis and hence large depth of focus because of its poor quality of laser beam. On this account, positional variation of a laser irradiated surface, which is caused by a mechanical error of a substrate transferring apparatus and a machining error of a substrate surface, has little effect on annealing performance. Here, the positional variation refers to positional variation in a vertical direction of a semiconductor film.

On the other hand, the excimer laser annealing has a problem in that carrier mobility as an annealing property is greatly changed depending on laser irradiation energy. As one of measures against this problem, a great attention is paid to a laser annealing apparatus (hereinafter referred to as "solid green laser annealing apparatus") using pulsed green laser beam, which is obtained from a second harmonic wave of an Nd:YAG laser, as a light source (for example, see Patent Documents 4 and 5). The use of this pulsed green laser allows a process margin for certain irradiation energy which is wider than that of an excimer laser.

However, since the solid green laser has power (below 0.1 J/pulse) significantly lower than that (maximum 1 J/pulse) of an commercialized excimer laser, there is a need to narrow a beam size in minor axis up to 100 μm or below. As a result, the depth of focus in minor axis is decreased and thus positional variation of a semiconductor film may have some effect on annealing performance.

The following Patent Documents 4 to 6 disclose an auto-focus mechanism applied to laser machining such as perforation and the like. This auto-focus mechanism monitors variation of a machining surface and keeps a light focusing point constant on the machining surface by moving an objective lens, which focuses laser beam on the machining surface, in an optical axis direction.

Patent Document 1: Japanese Patent No. 3204307
Patent Document 2: Japanese Unexamined Patent Application Publication No. 2000-338447
Patent Document 3: Japanese Patent No. 3191702
Patent Document 4: Japanese Unexamined Patent Application Publication No. 11-58053
Patent Document 5: Japanese Unexamined Patent Application Publication No. 11-23952
Patent Document 6: Japanese Patent No. 2835924
Non-patent Document 1: K. Nishida et. al., "Performance of Polycrystallization with High Power Solid Green Laser", AM-FPD 2006.
Non-patent Document 2: OKAMOTO Tatsuki et. al., "Development of Green Laser Annealing Optical System for Low-Temperature Polysilicon", RTM-05-28.

Non-Patent Document 2 shows an entire configuration of an optical system of a solid green laser annealing apparatus. For a major axial direction, this optical system splits laser beam into a plurality of laser beams in a rectangular waveguide made of quartz glass and superposes the plurality of laser beams on a semiconductor film on a glass substrate by means of an image lens. For a minor axial direction, the optical system turns the laser beam into parallel light of φ80 mm by means of an expander lens and focuses the parallel light on the glass substrate by means of a focusing lens as an objective lens.

In the solid green laser annealing apparatus shown in Non-Patent Document 2, when a machining surface is changed in a direction perpendicular to the machining surface, since the substrate is deviated from a focus position for the minor axial direction, energy density of the laser beam on a silicon film of the machining surface is changed. In a case of the optical system shown in Non-Patent Document 2, it is possible to avoid variation of the energy density by correcting a position of the condensing lens as the objective lens, like the auto-focus mechanism shown in Patent Documents 4 to 6.

However, a condensing lens used for a laser machining apparatus for perforation is relatively small while an objective lens (condensing lens or projection lens) used for a laser annealing apparatus is typically large, for example, has a dimension of 100 mm or above in minor axial direction× about 150 mm in major axial direction. On this account, a holder to hold such a lens group is large and very heavy. Accordingly, it is very difficult to move and vibrate the objective lens of the laser annealing apparatus with a precision of several microns in an optical axis direction in real time. In addition, although it may be considered to move and vibrate a substrate in a direction perpendicular to the substrate, since a substrate size for laser annealing is typically large (for example, more than 700 mm×900 mm), it is also difficult to vibrate a stage to support the substrate with a high precision. In addition, as to the major axial direction, since a depth of focus for the major axial direction is even larger than that for the minor axial direction, variation of a focus position has little effect on the annealing performance.

SUMMARY OF THE INVENTION

The present invention has been made in consideration of the above circumstances, and an object of the invention is to provide a laser annealing method and a laser annealing apparatus, which are capable of easily correcting a focus position of a rectangular beam in a minor axial direction depending on positional variation of a laser irradiated portion of a semiconductor film in laser annealing using a solid state laser.

To achieve the above object, the laser annealing method and the laser annealing apparatus of the present invention apply the following means.
(1) That is, there is provided a laser annealing method for shaping pulse-type laser beam, which comes from a solid state laser source, focusing the shaped laser beam as a rectangular beam on a surface of a semiconductor film, scanning the semiconductor film with the rectangular beam relatively in a minor axial direction, and thereby crystallizing the semiconductor film with laser irradiation. The laser beam is condensed onto the surface of the semiconductor film in the minor axial direction of the rectangular beam, using a minor-axis condenser lens to condense incident light in the minor axial direction and a projection lens to project light, which comes from the minor-axis condenser lens, onto the surface of the semiconductor film. Positional variation of a vertical direction of the semiconductor film in a laser irradiated portion of the semiconductor film is detected and the minor-axis condenser lens is moved in an optical axis direction based on a value of the detection.

When the minor-axis condenser lens is moved in the optical axis direction, a position of a primary image plane is accordingly moved in the optical axis direction depending on the amount of movement of the lens. In addition, a projection point (focus position) by the projection lens is moved depending on the amount of movement of the position of the primary imaging plane.

Accordingly, by detecting the position variation of the vertical direction of the semiconductor film in the laser irradiated portion of the semiconductor film and moving the minor-axis condenser lens in the optical axis direction on the basis of a value of the detection, it is possible to set a focus position of the minor axial direction of the rectangular beam on the surface of the semiconductor film even when there occurs positional variation of the semiconductor film 3 due to a mechanical error of a substrate transferring apparatus, etc.

In addition, the minor-axis condenser lens moved in correction of the focus position is disposed upstream of the projection lens in the optical axis direction, and is smaller and lighter than the projection lens, and as will be described later, the amount of correction on position of the minor-axis condenser lens with respect to the amount of positional variation of a degree of microns of the semiconductor film is a degree of mm. Accordingly, since the position of the small and light minor-axis condenser lens may be corrected with precision of a degree of mm, it is possible to make correction on the focus position with ease.
(2) In the laser annealing method, a plurality of minor-axis cylindrical lens arrays, which split incident light into a plurality of beams in the minor axial direction of the rectangular beam is disposed at intervals in the optical axis direction at positions of an optical axis direction upstream side of the minor-axis condenser lens, and a distance between the plurality of minor-axis cylindrical lens arrays is adjusted based on a value of the detection of the positional variation.

A factor to determine a size of an image on a primary image plane of the laser beam that passed through the minor-axis condenser lens includes a combined focus distance of the plurality of minor-axis cylindrical lens arrays disposed at an upstream side. In addition, a factor to determine the combined focus distance of the plurality of minor-axis cylindrical lens arrays includes a distance of the optical axis direction between the lens arrays. Accordingly, by changing the distance between the plurality of minor-axis cylindrical lens arrays, it is possible to adjust the size of the image of the primary imaging plane of the laser beam that passed through the minor-axis condenser lens, which may result in adjustment of a beam size at a focus position of the minor axial direction. Accordingly, even when there occurs positional variation of the semiconductor film, by adjusting the beam size at the focus position of the minor axial direction, it is possible to irradiate the surface of the semiconductor film with beams having the same size in the minor axial direction.
(3) There is provided a laser annealing apparatus including a solid state laser source that emits pulse-type laser beam, a beam shaping optical system that shapes the laser beam from the solid state laser source and condenses the shaped laser beam as a rectangular beam on a surface of a semiconductor film, and scanning means that scans the semiconductor film with the rectangular beam relatively in a minor axial direction to crystallize the semiconductor film with laser irradiation. The beam shaping optical system includes a major-axis homogenizer and a minor-axis homogenizer that condense incident laser beam on the surface of the semiconductor film in a major axial direction and a minor axial direction, respectively, of the rectangular beam. The minor-axis homogenizer includes a minor-axis condenser lens that condenses incident light in the minor axial direction, and a projection lens that projects light, which comes from the minor-axis condenser lens, onto the surface of the semiconductor film. The laser annealing apparatus further includes a positional variation detector that detects positional variation of a vertical direction of the semiconductor film in a laser irradiated portion of the semiconductor film, and a lens movement mechanism that moves the minor-axis condenser lens in an optical axis direction.
(4) In the laser annealing apparatus, the minor-axis homogenizer includes a plurality of minor-axis cylindrical lens arrays that split incident light into a plurality of beams in the minor axial direction of the rectangular beam and is disposed at positions of an optical axis direction upstream side of the minor-axis condenser lens, the plurality of minor-axis cylindrical lens arrays being disposed at intervals in the optical axis direction. The laser annealing apparatus further includes a distance adjustment mechanism that adjusts a distance between the plurality of minor-axis cylindrical lens arrays.

The laser annealing apparatus constructed as described above can carry out the laser annealing method. Accordingly, with the laser annealing apparatus of the present invention, it is possible to make correction on the focus position of the minor axial direction with ease. In addition, even when there occurs positional variation of the semiconductor film, by adjusting the beam size at the focus position of the minor axial direction, it is possible to irradiate the surface of the semiconductor film with beams having the same size in the minor axial direction.

(5) The laser annealing apparatus further includes a movement mechanism control part that controls the lens movement mechanism based on a detected value from the positional variation detector.

With such a movement mechanism control part, by controlling driving of the lens movement mechanism through a feedback control, it is possible to realize correction of the focus position of the minor axial direction through an automatic control.

(6) The laser annealing apparatus further includes an adjustment mechanism control part that controls the distance adjustment mechanism based on the detected value from the positional variation detector.

With such an adjustment mechanism control part, by controlling driving of the distance adjustment mechanism through a feedback control, it is possible to realize adjustment of a size of an image at the focus position of the minor axial direction through an automatic control.

(7) In the laser annealing apparatus, beam quality of the solid state laser source is more than 20 in terms of an $M^2$ value.

If beam quality is too good, an interference fringe is likely to occur. An interference fringe can be reduced by using a laser with the beam quality more than 20 in terms of an $M^2$ value.

(8) In the laser annealing apparatus, the beam shaping optical system includes an interference reduction optical system that reduces interference of the laser beam.

With such an interference reduction optical system, since interference of the rectangular beam can be reduced, it is possible to reduce an interference fringe in a beam irradiated portion.

(9) In the laser annealing apparatus, the laser beam emitted from the solid state laser source has a Gaussian-shape energy profile.

(10) In the laser annealing apparatus, the rectangular beam has a Gaussian-shape energy profile in the minor axial direction.

(11) In the laser annealing apparatus, the positional variation detector is a non-contact displacement sensor.

With such a non-contact displacement sensor, it is possible to detect positional variation of the semiconductor film with high precision in real time. The non-contact displacement sensor is suitably a laser type displacement sensor, an eddy current type displacement sensor, etc.

(12) The laser annealing apparatus includes a plurality of solid state laser sources and further includes means for temporally and/or spatially combining laser beams from the plurality of solid state laser sources.

In this manner, by combining the plurality of laser beams, a pulse frequency of the combined laser beam can be increased severalfold when they are temporally combined (with pulse periods deviated from each other), and energy density of the combined laser beam can be increased severalfold when they are spatially combined (with pulse periods coinciding with each other). Accordingly, a scanning speed of beams can be increased, which may result in increase of an annealing speed. In addition, for three or more laser beams, a mixture of temporal combination and spatial combination may be used.

(13) The laser annealing apparatus further includes a chamber setting a substrate deposited thereon with the semiconductor film and having a vacuum or inert gas atmosphere, or inert gas supplying means for supplying inert gas only to a restricted range of a laser irradiated portion of the semiconductor film and its peripheral portion.

In laser annealing, when a semiconductor film on the substrate is irradiated with the laser beam, if a laser beam irradiated portion contacts the air, there occur problems that unevenness or an oxide film is formed on a surface of the substrate or crystalline grains produced in a crystallization process becomes small.

With the chamber or the inert gas supplying means, the present invention can prevent the laser beam irradiated portion from contacting the air, thereby avoiding the above-mentioned various problems.

(14) The laser annealing apparatus further includes a substrate stage on which a substrate on which the semiconductor film is formed is placed, the substrate stage being heated to a temperature that does not exceed a melting point of the substrate.

By heating the substrate stage to the temperature that does not exceed a melting point of the substrate, laser annealing can be stably carried out without the substrate being melted. For example, in a case where the substrate is alkali-free glass, since its melting point is about 600° C., the substrate stage is heated to a temperature that does not exceed 600° C.

According to the above-described present invention, in the laser annealing using the solid state laser, it is possible to achieve a remarkable effect that the focus position of the minor axial direction of the rectangular beam can be easily corrected depending on positional variation of the laser irradiated portion of the semiconductor film.

BRIEF DESCRIPTION OF THE DRAWINGS

FIG. 5A is a schematic configuration view of a beam major axial direction of a laser annealing apparatus according to a third embodiment of the present invention.

FIG. 5B is a schematic configuration view of a beam minor axial direction of FIG. 5A.

DESCRIPTION OF THE PREFERRED EMBODIMENTS

Figure 1A:
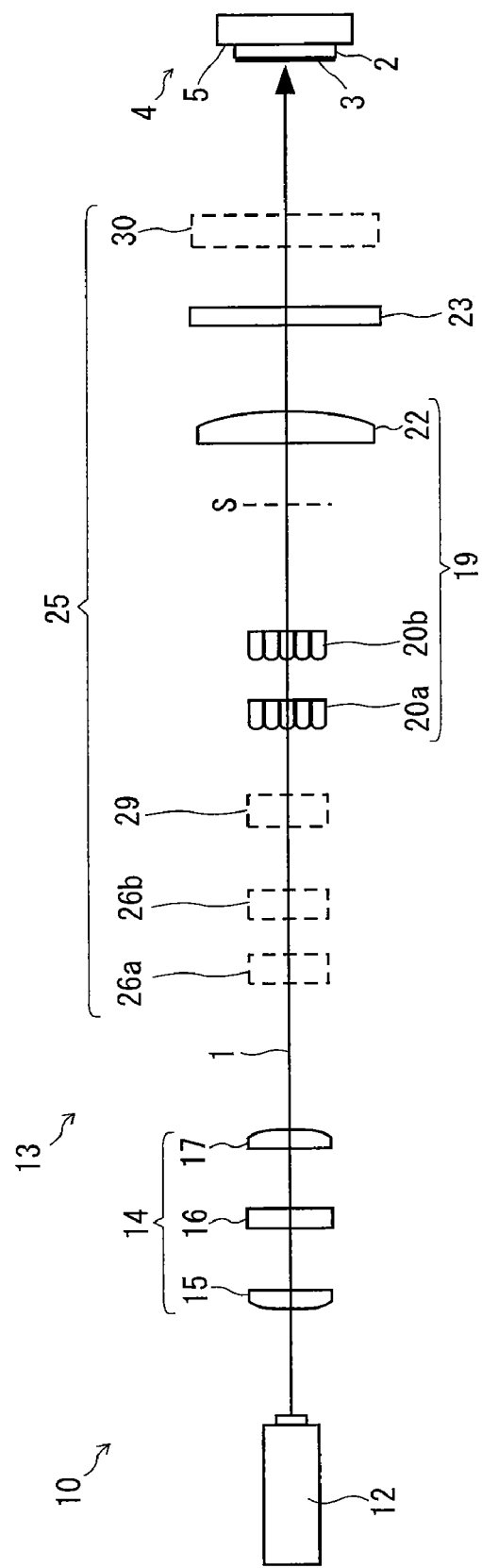
FIG. 1A is a schematic configuration view of a beam major axial direction of a laser annealing apparatus according to a first embodiment of the present invention.

Preferred embodiments of the present invention will be described below in detail with reference to the accompanying drawings. Same reference numerals are given to common portions in each of the drawings to avoid redundant description.

First Embodiment

Figure 1B:
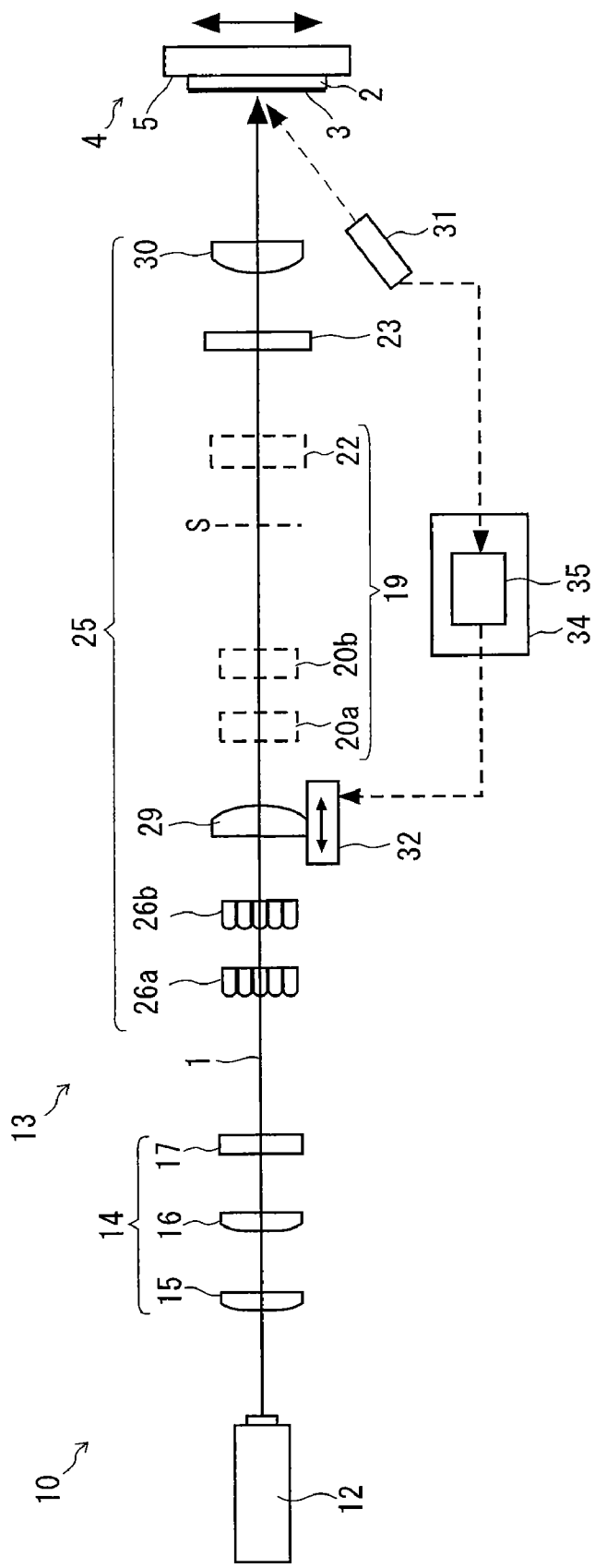
FIG. 1B is a schematic configuration view of a beam minor axial direction of FIG. 1A.

FIGS. 1A and 1B show a schematic configuration of a laser annealing apparatus 10 according to a first embodiment of the present invention. In FIG. 1A, a direction parallel to paper and perpendicular to an optical axis is a major axial direction of a rectangular beam, and in FIG. 1B, a direction parallel to paper and perpendicular to an optical axis is a minor axial direction of a rectangular beam.

In FIG. 1A, an optical system operating only in the minor axial direction is indicated by an imaginary line (dashed line). In FIG. 1B, an optical system operating only in the major axial direction is indicated by an imaginary line.

The laser annealing apparatus 10 includes a solid state laser source 12 that emits laser beam 1 of a pulse type, a beam shaping optical system 13 that shapes the laser beam 1 from the solid state laser source 12 and condenses the shaped laser beam 1 as a rectangular beam on a surface of a semiconductor film 3, and scanning means that scans the semiconductor film 3 with the rectangular beam relatively in the minor axial direction to crystallize the semiconductor film 3 with laser irradiation.

In this embodiment, a substrate 2 is a glass substrate (for example, alkali-free glass). A $SiO_2$ film is formed at thickness of, for example, 200 nm on the glass substrate by a film deposition method such as a plasma CVD method, a sputtering method or the like, and an a-Si film is deposited as the semiconductor film 3 at thickness of 50 nm, for example, on the $SiO_2$ film.

The substrate 2 is supported by a substrate stage 5 and is transferred in the minor axial direction of the rectangular beam. Movement of the substrate stage 5 allows the a-Si film on the substrate 2 to be scanned with the rectangular beam relatively in the minor axial direction. That is, in this embodiment, the substrate stage 5 constitutes laser scanning means 4.

The substrate stage 5 is heated to a predetermined temperature by means of heating means (not shown). At this time, the substrate stage 5 is heated to a temperature that does not exceed a melting point of the substrate 2. Thus, laser annealing can be stably carried out without the substrate 2 being melted. For example, in a case where the substrate 2 is alkali-free glass, since its melting point is about 600° C., the substrate stage 5 is heated to a temperature that does not exceed 600° C.

The solid state laser source 12 outputs the laser beam 1 at a pulse frequency of, for example, 2 to 4 kHz. The laser beam 1 has a Gaussian-shape energy profile. The solid state laser source 12 is not particularly limited in its kind but may be preferably one of an Nd:YAG laser, an Nd:YLF laser, an Nd:$YVO_4$ laser, an Nd:glass laser, a Yb:YAG laser, a Yb:YLF laser, a Yb:$YVO_4$ laser and a Yb:glass laser. These solid state lasers may be realized with high reliability and high use efficiency of stable laser energy. In addition, since the silicon film has a high absorption coefficient in a range of visible light of 330 nm to 800 nm, the solid state laser source 12 preferably emits the laser beam 1 of a second or third harmonic wave of the YAG laser, the YLF laser, the $YVO_4$ laser, or the glass laser.

If beam quality is too good, an interference fringe is likely to occur. Accordingly, beam quality of the solid state laser source 12 is preferably more than 20 in terms of an $M^2$ value. The interference fringe can be reduced by using a laser with such beam quality.

The laser beam 1 emitted from such a solid state laser source 12 is incident into the beam shaping optical system 13.

The beam shaping optical system 13 includes a beam expander 14 that expands the laser beam 1 from the solid state laser source 12 in the major axial direction and the minor axial direction, a major-axis direction homogenizer 19 that condenses the incident laser beam 1 on the surface of the semiconductor film 3 in the major axial direction of the rectangular beam, and a minor-axis homogenizer 25 that condenses the incident laser beam 1 on the surface of the semiconductor film 3 in the minor axial direction of the rectangular beam.

The beam expander 14 shown as one configuration example includes a convex spherical lens 15, a minor-axis cylindrical lens 16 expanding the laser in the minor axial direction, and a major-axis cylindrical lens 17 expanding the laser in the major axial direction. In the beam expander 14 constructed so, expansion ratios of the major axial direction and minor axial direction can be separately set. In addition, the beam expander 14 may have other suitable configuration, for example, a combination of a concave spherical lens and a convex spherical lens.

As shown in FIG. 1A, the major-axis homogenizer 19 includes a plurality of major-axis cylindrical lens arrays 20a and 20b that splits the incident laser beam 1 into a plurality of beams in the major axial direction, and a major-axis condenser lens 22 that condenses the plurality of beams, into which the laser beam 1 is split in the major axial direction, on the surface of the semiconductor film 3 in the major axial direction. In this embodiment, two major-axis cylindrical lens arrays 20a and 20b are disposed at an interval in the optical axis direction.

In the major-axis homogenizer 19 constructed so, the laser beam 1 expanded by the beam expander 14 is split into the plurality of beams by the major-axis cylindrical lens arrays 20a and 20b in the major axial direction. The laser beam 1 split through the major-axis cylindrical lens arrays 20a and 20b is imaged as an elongated rectangular beam on the surface of the semiconductor film 3 on the substrate 2 in the major axial direction by the major-axis condenser lens 22. In addition, a reflecting mirror 23 is interposed between the major-axis condenser lens 22 and the substrate 2 for reflecting light, which comes from the major-axis condenser lens 22, toward the substrate 2.

Length of the major axial direction of the rectangular beam with which the substrate 2 is irradiated may be, for example, several tens of millimeters. An energy profile of the major axial direction of the rectangular beam shaped by the major-axis homogenizer 19 is equalized to change the rectangular beam from a Gaussian shape into a flat top shape.

The minor-axis homogenizer 25 includes a minor-axis condenser lens 29 that condenses the incident laser beam 1 in the minor axial direction, and a projection lens 30 that projects light, which comes from the minor-axis condenser lens 29, onto the surface of the semiconductor film 3. In this embodiment, the minor-axis homogenizer 25 further includes two minor-axis cylindrical lens arrays 26a and 26b for splitting the incident light into a plurality of beams in the minor axial direction, which are located at an optical axis direction upstream side of the minor-axis condenser lens 29 and are disposed at an interval in the optical axis direction.

In the minor-axis homogenizer 25 constructed so, the laser beam 1 expanded by the beam expander 14 is split into the plurality of beams by the minor-axis cylindrical lens arrays 26a and 26b in the minor axial direction. The laser beam 1 split through the minor-axis cylindrical lens arrays 26a and 26b is condensed in the minor axial direction by the minor-axis condenser lens 29 and is imaged on a primary imaging plane S, and then is incident by the projection lens 30. An image on the primary imaging plane S is reduction-projected on the surface of the semiconductor film 3 on the substrate 2 in the minor axial direction by the projection lens 30. In addition, the laser beam 1 from the minor-axis condenser lens 29 is reflected toward the substrate 2 by the reflecting mirror 23.

Length of the minor axial direction of the rectangular beam with which the substrate 2 is irradiated may be, for example, several tens of micrometers. An energy profile of the minor axial direction of the rectangular beam shaped by the minor-axis homogenizer 25 is equalized to change the rectangular beam from a Gaussian shape into a flat top shape.

As shown in FIG. 1B, the laser annealing apparatus 10 further includes a positional variation detector 31, a lens movement mechanism 32 and a controller 34.

The positional variation detector 31 detects positional variation of a vertical direction of the semiconductor film 3 in a laser irradiated portion of the semiconductor film 3. Accordingly, by the positional variation detector 31, it is possible to detect the positional variation of the surface of the semiconductor film 3, which is caused by a mechanical error of a substrate transferring apparatus and a machining error of a substrate surface.

The number of positional variation detectors 31 may be one or more. In a case of a single positional variation detector 31, it can detect variation of a central position of the major axial direction of the rectangular beam in the laser irradiated portion of the semiconductor film 3 and set the detected value as representative positional variation. In a case of a plurality of positional variation detectors 31, they can detect positional variation of a plurality of points of the major axial direction of the rectangular beam in the laser irradiated portion of the semiconductor film 3 and set a average of the detected values as positional variation.

The positional variation detector 31 is preferably a non-contact displacement sensor. By using such a non-contact displacement sensor, it is possible to detect positional variation of the semiconductor film 3 with high precision in real time. In this embodiment, the non-contact displacement sensor is shown as a laser type displacement sensor but may be an eddy current type displacement sensor, an ultrasonic wave type displacement sensor, etc.

The lens movement mechanism 32 serves to move the minor-axis condenser lens 29 in the optical axis direction. The controller 34 has a movement mechanism control part 35 for controlling the lens movement mechanism 32 based on a detected value from the positional variation detector 31.

When the minor-axis condenser lens 29 is moved in the optical axis direction, a position of the primary image plane S is accordingly moved in the optical axis direction depending on the amount of movement of the lens 29. In addition, a projection point (focus position) by the projection lens 30 is moved depending on the amount of movement of the position of the primary imaging plane S.

Accordingly, by detecting the position variation of the vertical direction of the semiconductor film 3 in the laser irradiated portion of the semiconductor film 3 by means of the positional variation detector 31, and moving the minor-axis condenser lens 29 in the optical axis direction by means of the movement mechanism control part 35 on the basis of a detected value, it is possible to set a focus position of the minor axial direction of the rectangular beam on the surface of the semiconductor film 3 even when there occurs positional variation of the semiconductor film 3 due to a mechanical error of a substrate transferring apparatus, etc. In this manner, by controlling driving of the lens movement mechanism 32 through a feedback control, it is possible to realize correction of the focus position of the minor axial direction through an automatic control.

Figure 2A:
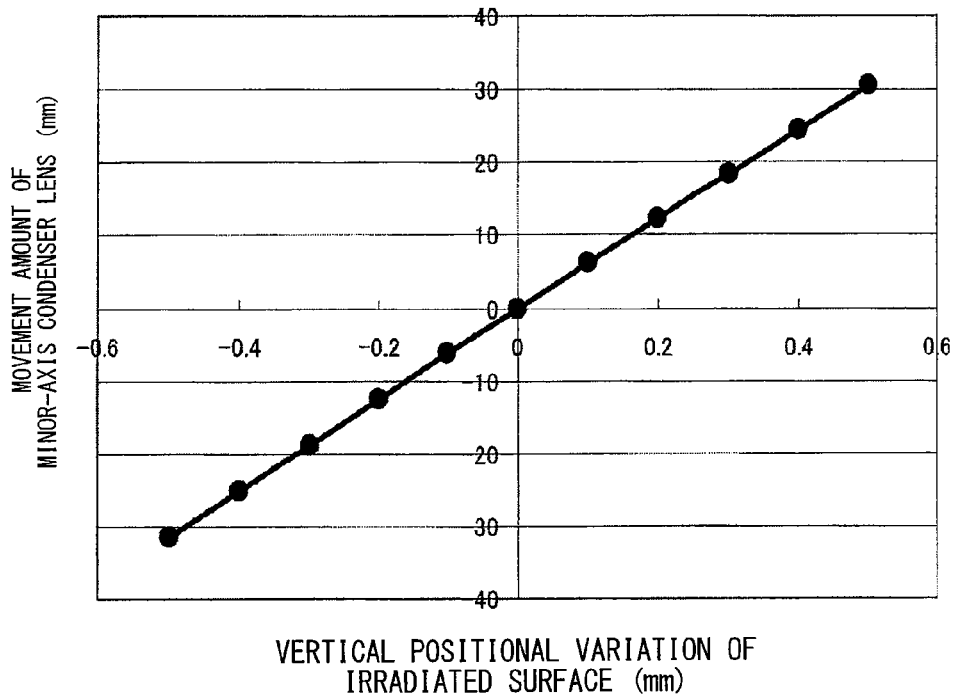
FIG. 2A is a view showing a relationship between the amount of variation of a laser irradiated portion (machining surface) and the amount of movement of a minor-axis condenser lens.
Figure 2B:
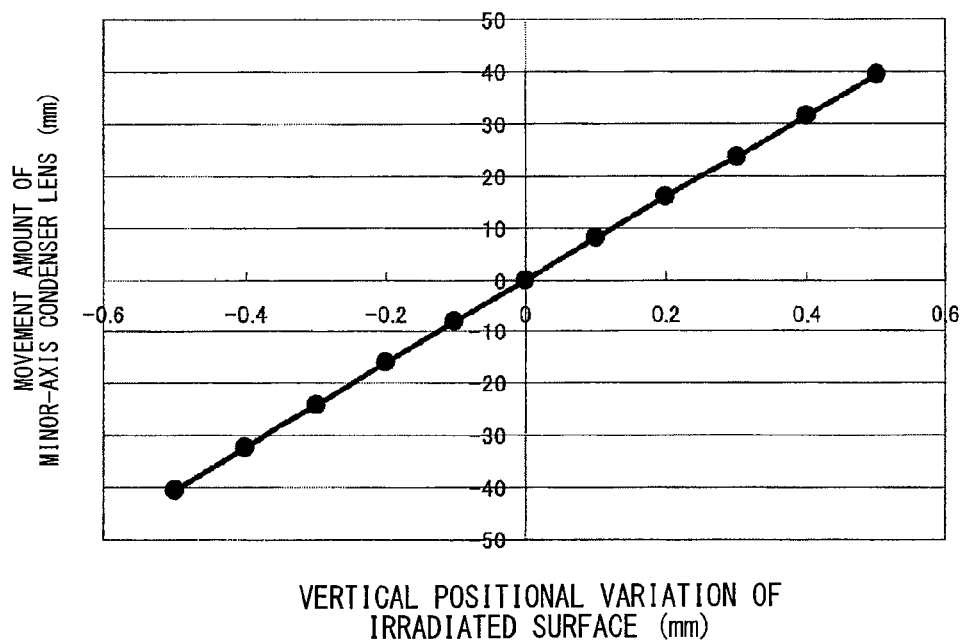
FIG. 2B is a view showing the same relationship as FIG. 2A for a different focus distance of the minor-axis condenser lens.

FIGS. 2A and 2B show views showing a relationship between the amount of variation of a laser irradiated portion (machining surface) and the amount of movement of the minor-axis condenser lens 29. FIG. 2A shows a case where focus distances of the minor-axis condenser lens 29 and the projection lens 30 are 650 mm and 300 mm, respectively, and FIG. 2B shows a case where focus distances of the minor-axis condenser lens 29 and the projection lens 30 are 750 mm and 300 mm.

In FIG. 2A, when a laser irradiated portion is varied by ±0.5 mm, by moving the minor-axis condenser lens 29 by ±30 mm, it is possible to set the focus position of the minor axial direction of the rectangular beam on the surface of the semiconductor film 3.

In FIG. 2B, when a laser irradiated portion is varied by ±0.5 mm, by moving the minor-axis condenser lens 29 by ±40 mm, it is possible to set the focus position of the minor axial direction of the rectangular beam on the surface of the semiconductor film 3.

In this manner, the amount of correction on position of the minor-axis condenser lens 29 with respect to the amount of positional variation of a degree of microns of the semiconductor film 3 is a degree of mm.

The minor-axis condenser lens 29 moved in correction of the focus position is disposed upstream of the projection lens 30 in the optical axis direction and is smaller and lighter than the projection lens 30.

Accordingly, according to this embodiment, since the position of the small and light minor-axis condenser lens 29 may be corrected with precision of a degree of mm, it is possible to make correction on the focus position with ease.

Second Embodiment

Figure 3A:
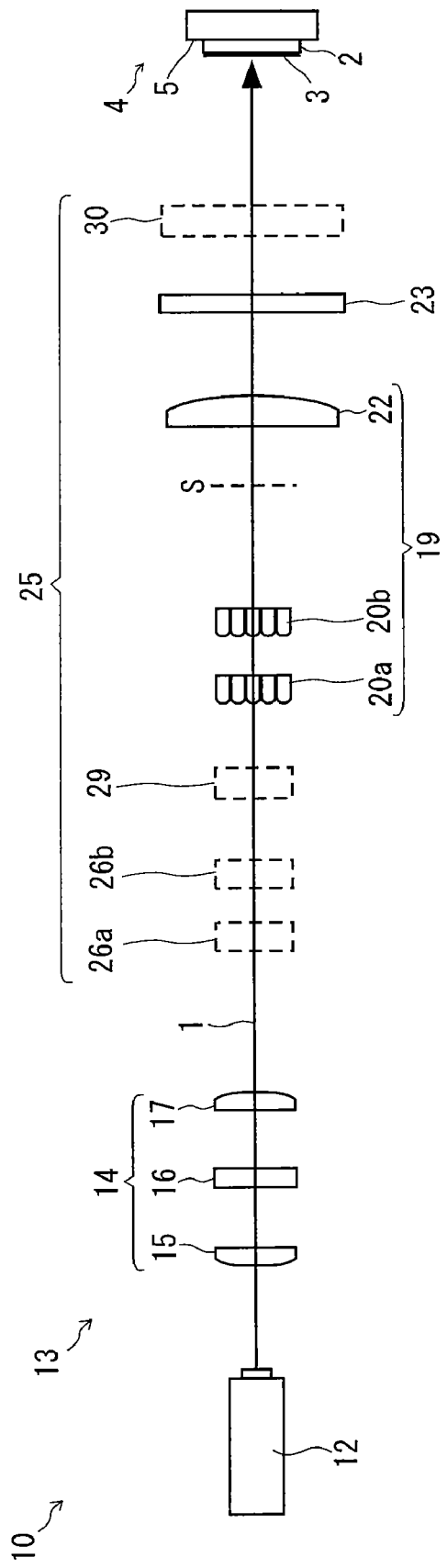
FIG. 3A is a schematic configuration view of a beam major axial direction of a laser annealing apparatus according to a second embodiment of the present invention.
Figure 3B:
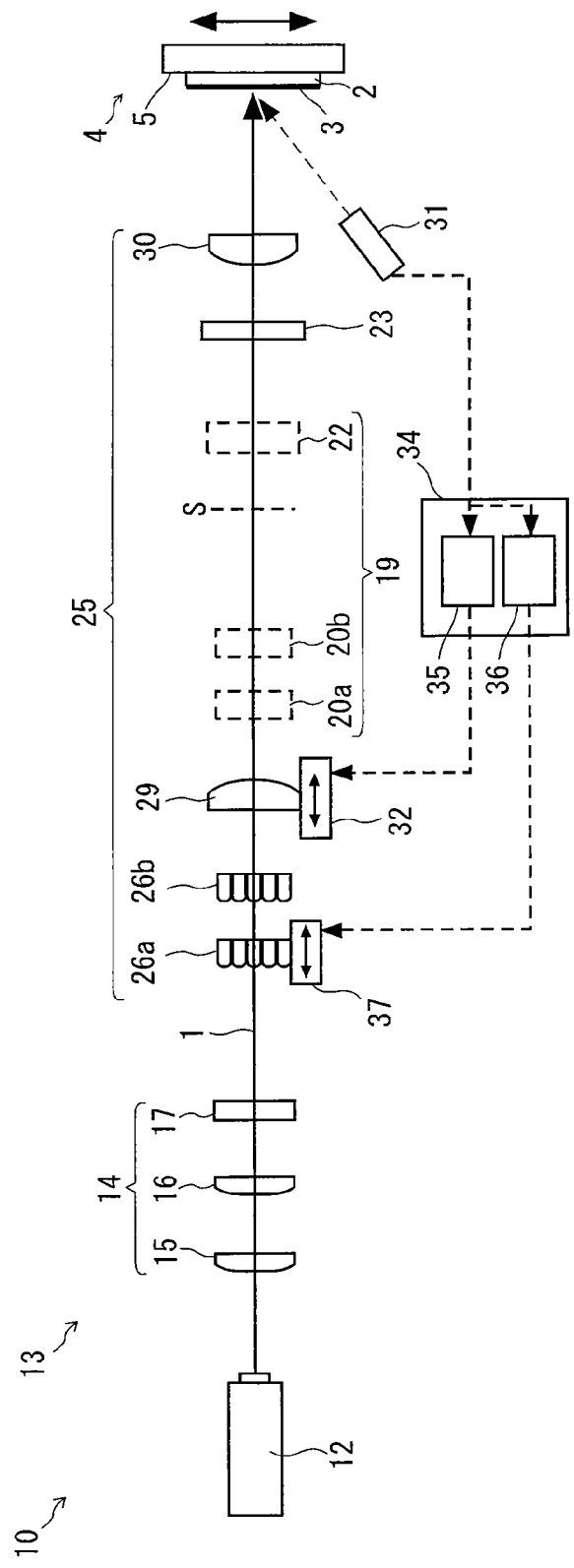
FIG. 3B is a schematic configuration view of a beam minor axial direction of FIG. 3A.

FIGS. 3A and 3B are schematic configuration views of a laser annealing apparatus 10 according to a second embodiment of the present invention.

The laser annealing apparatus 10 of this embodiment includes a distance adjustment mechanism 37 for adjusting distances between a plurality of minor-axis cylindrical lens arrays 26a and 26b. In this embodiment, by moving the minor-axis cylindrical lens array 26a at an upstream side of the optical axis direction in the optical axis direction, a distance between two minor-axis cylindrical lens arrays 26a and 26b can be adjusted. Alternatively, this distance may be adjusted by moving the minor-axis cylindrical lens array 26b at a downstream side of the optical axis direction or both of the two minor-axis cylindrical lens arrays 26a and 26b in the optical axis direction. A controller 34 has an adjustment mechanism control part 36 for controlling the distance adjustment mechanism 37 based on a detected value from the positional variation detector 31. Other portions are the same as in the first embodiment.

Figure 4A:
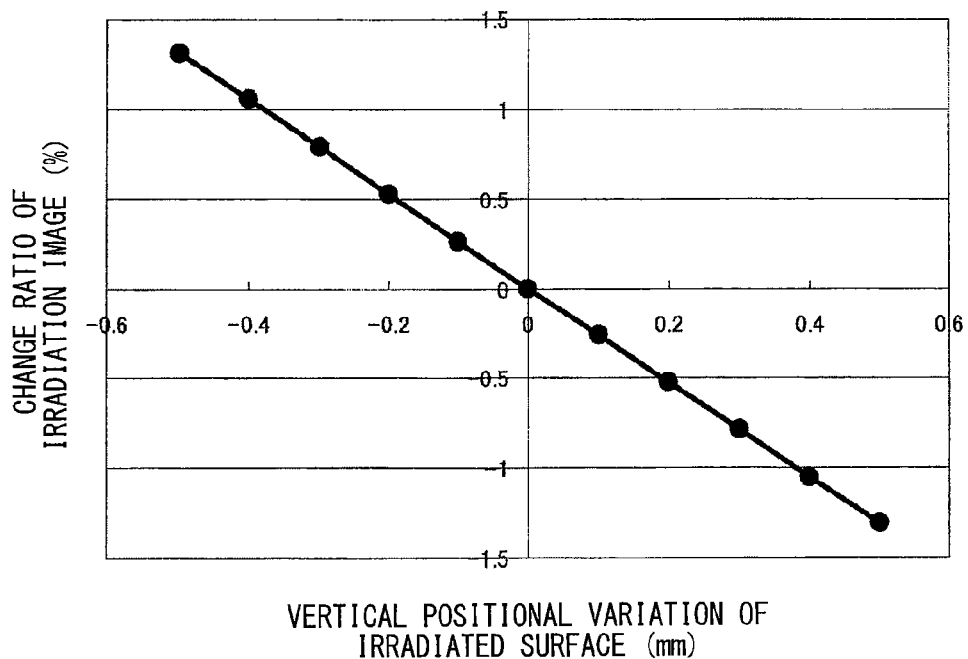
FIG. 4A is a view showing a relationship between the amount of variation of a laser irradiated portion (machining surface) and a change ratio of a size of an image in the laser irradiated portion.
Figure 4B:
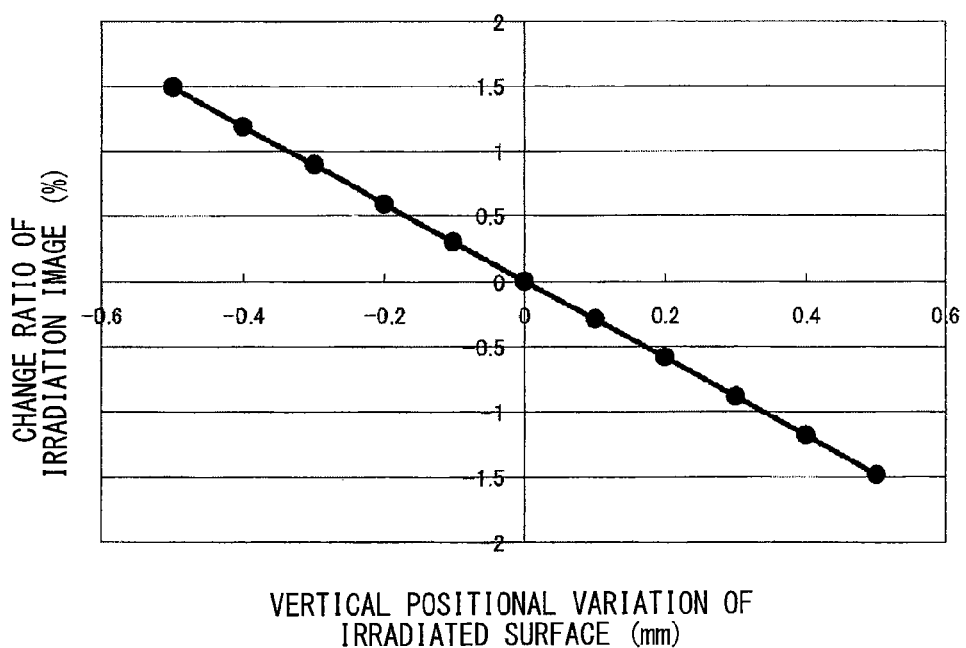
FIG. 4B is a view showing the same relationship as FIG. 4A for a different focus distance of a minor-axis condenser lens.

FIGS. 4A and 4B are views showing a relationship between the amount of variation of a laser irradiated portion (machining surface) and a change ratio of a size of an image in the laser irradiated portion when distances between a plurality of cylindrical lens arrays are set to be constant. FIG. 4A shows a case where focus distances of the minor-axis condenser lens 29 and the projection lens 30 are 650 mm and 300 mm, respectively, and FIG. 4B shows a case where focus distances of the minor-axis condenser lens 29 and the projection lens 30 are 750 mm and 300 mm.

In either FIG. 4A or FIG. 4B, when a laser irradiated portion is varied by ±0.5 mm, a change ratio of a size of an image is less than 1.5%.

A factor to determine a size D of an image on a primary image plane of the laser beam 1 that passed through the minor-axis condenser lens 29 includes a combined focus distance $f_0$ of the plurality of minor-axis cylindrical lens arrays 26a and 26b disposed at an upstream side. Specifically, the size D of the image on the primary image plane is expressed by the following equation (1). In the equation (1), w represents width of the minor axial direction of each of the minor-axis cylindrical lens arrays 26a and 26b, and $f_1$ represents a focus distance of the minor-axis condenser lens 29.

$$D = w \cdot (f_1/f_0) \quad (1)$$

In addition, a factor to determine the combined focus distance $f_0$ of the plurality of minor-axis cylindrical lens arrays 26a and 26b includes a distance d of the optical axis direction between the lens arrays. Specifically, the combined focus distance $f_0$ is expressed by the following equation (2). In the equation (2), $f_0'$ represents a focus distance of each of the minor-axis cylindrical lens arrays 26a and 26b.

$$f_0 = (f_0' \times f_0')/(2f_0' - d) \quad (2)$$

Accordingly, by changing the distance between the plurality of minor-axis cylindrical lens arrays, it is possible to adjust the size of the image of the primary imaging plane of the laser beam 1 that passed through the minor-axis condenser lens 29, which may result in adjustment of a beam size at a focus position of the minor axial direction.

Accordingly, according to this embodiment, by detecting the position variation of the vertical direction of the semiconductor film 3 in the laser irradiated portion of the semiconductor film 3 by means of the positional variation detector 31, and controlling the distance adjustment mechanism 37 by means of the adjustment mechanism control part 36 on the basis of a detected value to move the minor-axis cylindrical lens arrays 26a, 26b in the optical axis direction, thereby adjusting the distance between the cylindrical lens arrays and hence adjusting the beam size at the focus position of the minor axial direction, it is possible to irradiate the semiconductor film 3 with beams having the same size in the minor axial direction even when there occurs positional variation of the laser irradiated portion on the semiconductor film 3. In this manner, by controlling driving of the distance adjustment mechanism 37 through a feedback control, it is possible to realize adjustment of a size of an image at the focus position of the minor axial direction through an automatic control.

Third Embodiment

FIGS. 5A and 5B are schematic configuration views of a laser annealing apparatus 10 according to a third embodiment of the present invention.

This embodiment is not provided with the minor-axis cylindrical lens arrays 26a and 26b shown in the first embodiment. Other portions are the same as in the first embodiment.

Accordingly, in this embodiment, although an energy profile of the minor axial direction has a Gaussian shape, by moving the minor-axis condenser lens 29 in the optical axis direction based on a detected value from the positional variation detector 31, like the first embodiment, it is possible to set the focus position of the minor axial direction of the rectangular beam on the surface of the semiconductor film 3.

Other Embodiment 1

Figure 6A:
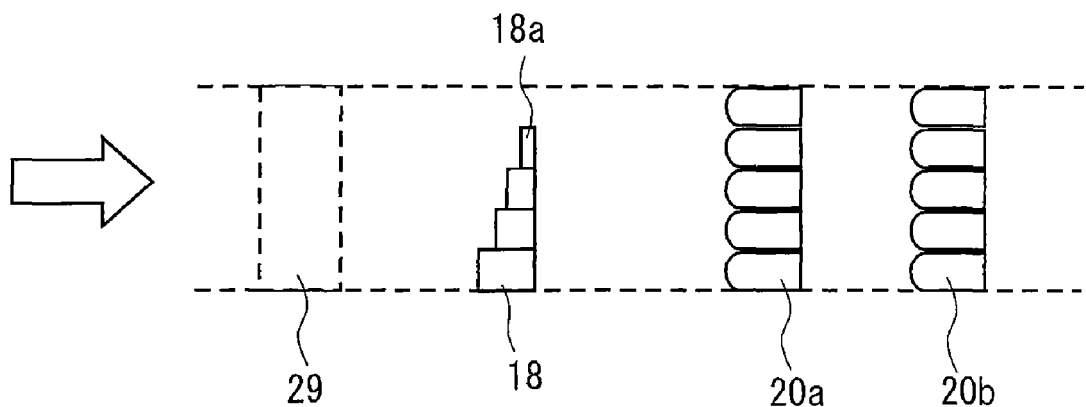
FIG. 6A is a view showing a configuration of an interference reduction optical system for a major axis of a laser annealing apparatus according to another embodiment of the present invention.
Figure 6B:
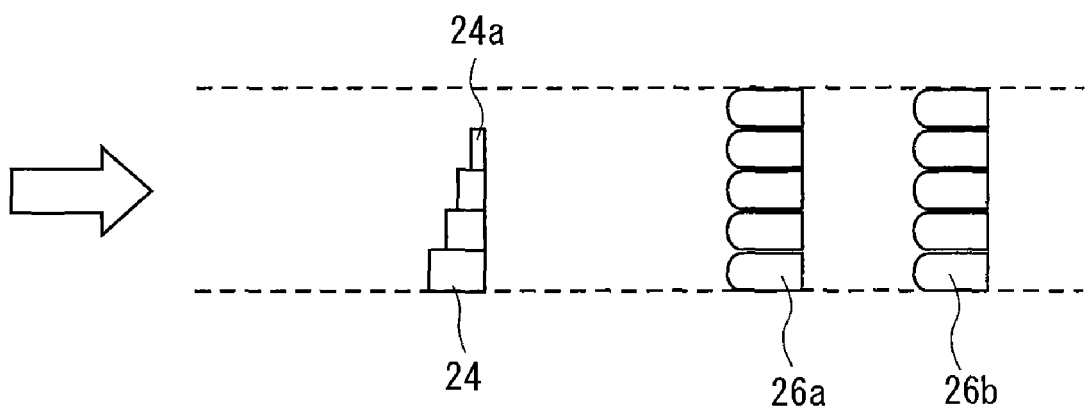
FIG. 6B is a view showing a configuration of an interference reduction optical system for a minor axis of a laser annealing apparatus according to another embodiment of the present invention.

In the above-described embodiments, it is preferable that the beam shaping optical system has an interference reduction optical system for reducing interference of laser beam. FIGS. 6A and 6B show examples of configuration of such an interference reduction optical system. The interference reduction optical system includes a major-axis interference reduction optical system 18 for reducing interference of the major axial direction of the laser beam of FIG. 6A, and a minor-axis interference reduction optical system 24 for reducing interference of the minor axial direction of FIG. 6B.

The major-axis interference reduction optical system 18 as shown in FIG. 6A is disposed at an upstream side of the optical axis direction of the major-axis cylindrical lens arrays 20a and 20b. The major-axis interference reduction optical system 18 includes a plurality of transparent glass plates 18a. Each transparent glass plate has the same width as that of each of cylindrical lenses constituting the major-axis cylindrical lens arrays 20a and 20b. The transparent glass plates 18a have respective optical axis direction lengths which are different from each other by a predetermined length larger than a coherent length of the laser beam 1 and are arranged in the major axial direction. Since optical paths of the laser beams 1 that passed through the transparent glass plates 18a become long by a glass length by the major-axis interference reduction optical system 18, the laser beams 1 have respective optical path differences of distances longer than the coherent length, thereby alleviating an effect of coherence and thus providing no interference with each other.

The minor-axis interference reduction optical system 24 as shown in FIG. 6B is disposed at an upstream side of the optical axis direction of the minor-axis cylindrical lens arrays 26a and 26b. The minor-axis interference reduction optical system 24 includes a plurality of transparent glass plates 24a. Each transparent glass plate 24a has the same width as that of each of cylindrical lenses constituting the minor-axis cylindrical lens arrays 26a and 26b. The transparent glass plates 24a have respective optical axis direction lengths which are different from each other by a predetermined length larger than a coherent length of the laser beam 1 and are arranged in the minor axial direction. Since optical paths of the laser beams 1 that passed through the transparent glass plates 24a become long by a glass length by the minor-axis interference reduction optical system 24, the laser beams 1 have respective optical path differences of distances longer than the coherent length, thereby alleviating an effect of coherence and thus providing no interference with each other.

In addition, the interference reduction optical system may be configured by a depolarizing apparatus having a function of converting passing light into random polarized light or may employ other configurations known in the art. For example, the interference reduction optical system may employs a configuration disclosed in Japanese Unexamined Patent Application Publication No. 2002-321081 or a configuration disclosed in FIG. 4 of Japanese Unexamined Patent Application Publication No. 2004-341299.

Other Embodiment 2

In the above-described embodiments, it is preferable to further include a plurality of solid state laser sources 12 and means for temporally and/or spatially combining laser beams from the plurality of solid state laser sources 12. Such combining means may be configured by a combination of a reflecting mirror and a polarizing beam splitter.

In this manner, by combining the plurality of laser beams, a pulse frequency of the combined laser beam can be increased severalfold when they are temporally combined (with pulse periods deviated from each other), and energy density of the combined laser beam can be increased severalfold when they are spatially combined (with pulse periods coinciding with each other). Accordingly, a scanning speed of beams can be increased, which may result in increase of an annealing speed. In addition, for three or more laser beams, a mixture of temporal combination and spatial combination may be used.

Other Embodiment 3

In the above-described embodiments, it is preferable to further include a chamber setting a substrate on which a semiconductor film is formed and used for generating a vacuum or inert gas atmosphere in setting space of the substrate, or inert gas supplying means for supplying inert gas only to a restricted range of a laser irradiated portion of the substrate and its peripheral portion. An example of configuration of the chamber and the inert gas supplying means is shown in FIGS. 7A and 7B.

Figure 7A:
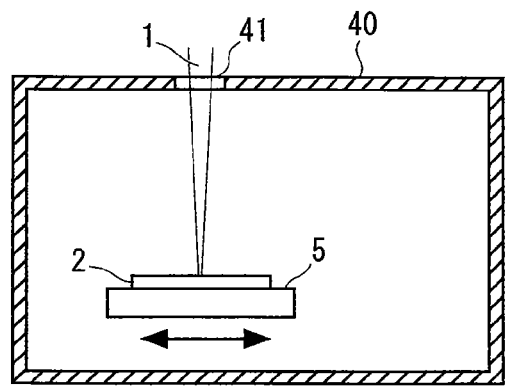
FIG. 7A is a view showing a configuration of a chamber of a laser annealing apparatus according to another embodiment of the present invention.

A chamber 40 shown in FIG. 7A contains a substrate stage 5 to support a substrate 2, and is configured such that inside atmosphere of the chamber 40 is a vacuum or inert gas atmosphere. The substrate stage 5 is configured to be movable in a minor axial direction in order to scan the substrate 2 with laser beam 1 shaped into a rectangular beams. The laser beam 1 is irradiated on the substrate 2 through a transmission widow 41 provided in the chamber 40.

Figure 7B:
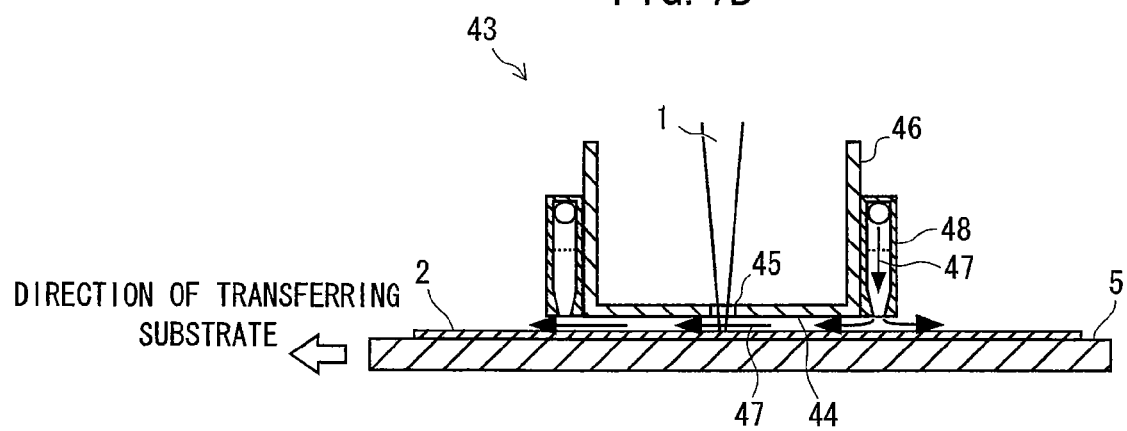
FIG. 7B is a view showing a configuration of an inert gas supplying means of a laser annealing apparatus according to another embodiment of the present invention.

Inert gas supplying means 43 shown in FIG. 7B includes a parallel facing body 46 which has a bottom side 44 closely facing in parallel to the substrate 2, forms a flow path of inert gas 47 between the bottom side 44 and the substrate 2, and has a transmission widow 45 through which the laser beam 1 is transmitted, and gas ejecting means 48 that ejects the inert gas 47, which has a flow rate equalized in a beam major axial direction, onto a surface of the substrate 2 at a position with a predetermined interval from a laser beam 1 irradiated portion in a beam minor axial direction.

In laser annealing, when a semiconductor film on the substrate 2 is irradiated with the laser beam 1, if a laser beam irradiated portion contacts the air, there occur problems that unevenness or an oxide film is formed on a surface of the substrate or crystalline grains produced in a crystallization process becomes small.

The above-constructed chamber 40 or inert gas supplying means 43 can prevent the laser beam irradiated portion from contacting the air, thereby avoiding the above-mentioned various problems. In addition, the inert gas supplying means 43 is not limited to the configuration shown in FIG. 7B but may have other configurations as long as they can have a function of supplying inert gas only to a restricted range of a laser irradiated portion of the substrate 2 and its peripheral portion. For example, the inert gas supplying means 43 employs a configuration shown in FIG. 2 or 4 of Japanese Patent No. 3502981.

While preferred embodiments of the present invention have been described and shown above, the disclosed embodiments have been provided for the purpose of illustration but the present invention is not limited to the disclosed embodiments. The scope of the invention is defined as set forth in the appended claims and is intended to encompass all modifications, changes and alternations which fall within the appended claims or the equivalents thereof.

The invention claimed is:

1. A laser annealing method for shaping pulse-type laser beam, which is emitted from a solid state laser source, condensing the shaped laser beam as a rectangular beam on a surface of a semiconductor film, scanning the semiconductor film with the rectangular beam relatively in a minor axial direction, and thereby crystallizing the semiconductor film with laser irradiation, the laser annealing method comprising:

projecting the laser beam onto the surface of the semiconductor film in the minor axial direction of the rectangular beam, using a minor-axis condenser lens to condense incident light in the minor axial direction and a projection lens to project light, which comes from the minor-axis condenser lens, onto the surface of the semiconductor film, and detecting positional variation in a vertical direction of the semiconductor film in a laser irradiated portion of the semiconductor film, and moving the minor-axis condenser lens in an optical axis direction based on a value of the detection.

2. The laser annealing method according to claim 1, wherein a plurality of minor-axis cylindrical lens arrays, which split incident light into a plurality of beams in the minor axial direction of the rectangular beam, are disposed at intervals in the optical axis direction at positions of an optical axis direction upstream side of the minor-axis condenser lens, and wherein a distance between the plurality of minor-axis cylindrical lens arrays is adjusted based on a value of the detection of the positional variation.

3. A laser annealing apparatus including a solid state laser source that emits pulse-type laser beam, a beam shaping optical system that shapes the laser beam from the solid state laser source and condenses the shaped laser beam as a rectangular beam on a surface of a semiconductor film, and scanning means that scans the semiconductor film with the rectangular beam relatively in a minor axial direction to crystallize the semiconductor film with laser irradiation, wherein the beam shaping optical system includes a major-axis homogenizer and a minor-axis homogenizer that project incident laser beam on the surface of the semiconductor film in a major axial direction and a minor axial direction, respectively, of the rectangular beam, and wherein the minor-axis homogenizer includes a minor-axis condenser lens that condenses incident light in the minor axial direction, and a projection lens that projects light, which comes from the minor-axis condenser lens, onto the surface of the semiconductor film, the laser annealing apparatus further comprising a positional variation detector that detects positional variation of a vertical direction of the semiconductor film in a laser irradiated portion of the semiconductor film, and a lens movement mechanism that moves the minor-axis condenser lens in an optical axis direction.

4. The laser annealing apparatus according to claim 3, wherein the minor-axis homogenizer includes a plurality of minor-axis cylindrical lens arrays that splits incident light into a plurality of beams in the minor axial direction of the rectangular beam and are disposed at positions of an optical axis direction upstream side of the minor-axis condenser lens, the plurality of minor-axis cylindrical lens arrays being disposed at intervals in the optical axis direction, the laser annealing apparatus further comprising a distance adjustment mechanism that adjusts a distance between the plurality of minor-axis cylindrical lens arrays.

5. The laser annealing apparatus according to claim 3, further comprising a movement mechanism control part that controls the lens movement mechanism based on a detected value from the positional variation detector.

6. The laser annealing apparatus according to claim 4, further comprising an adjustment mechanism control part that controls the distance adjustment mechanism based on the detected value from the positional variation detector.

7. The laser annealing apparatus according to claim 3, wherein beam quality of the solid state laser source is more than 20 in terms of an $M^2$ value.

8. The laser annealing apparatus according to claim 3, wherein the beam shaping optical system includes an interference reduction optical system that reduces interference of the laser beam.

9. The laser annealing apparatus according to claim 3, wherein the laser beam emitted from the solid state laser source has a Gaussian-shape energy profile.

10. The laser annealing apparatus according to claim 3, wherein the rectangular beam has a Gaussian-shape energy profile in the minor axial direction.

11. The laser annealing apparatus according to claim 3, wherein the positional variation detector is a non-contact displacement sensor.

12. The laser annealing apparatus according to claim 3, comprising a plurality of solid state laser sources and further comprising means for temporally and/or spatially combining laser beams from the plurality of solid state laser sources.

13. The laser annealing apparatus according to claim 3, further comprising a chamber setting a substrate formed thereon with the semiconductor film and having a vacuum or inert gas atmosphere, or inert gas supplying means for supplying inert gas only to a restricted range of a laser irradiated portion of the semiconductor film and its peripheral portion.

14. The laser annealing apparatus according to claim 3, further comprising a substrate stage on which a substrate on which the semiconductor film is formed is placed, the substrate stage being heated to a temperature that does not exceed a melting point of the substrate.

15. The laser annealing apparatus according to claim 5, further comprising an adjustment mechanism control part that controls the distance adjustment mechanism based on the detected value from the positional variation detector.

* * * * *